(12) United States Patent
Bermudez

(10) Patent No.: US 10,883,671 B2
(45) Date of Patent: Jan. 5, 2021

(54) OPTICAL DEVICE AUGMENTING THE EMISSION OF ELECTRO-LUMINESCENT LIGHT SOURCES WITH HELP OF A DICHROIC ZNO NANOROD COMPRISING FILTER

(71) Applicant: OPTICAL SAVER TECHNOLOGIES, S.A.P.I. DE C.V., Complejo Industrial Cuamatla (MX)

(72) Inventor: Enrique Capilla Bermudez, Complejo Industrial Cuamatla (MX)

(73) Assignee: Optical Saver Technologies, S.A.P.I. de C.V., Estado de Mexico (MX)

( * ) Notice: Subject to any disclaimer, the term of this patent is extended or adjusted under 35 U.S.C. 154(b) by 0 days.

(21) Appl. No.: 16/462,594

(22) PCT Filed: Nov. 23, 2017

(86) PCT No.: PCT/MX2017/000135
§ 371 (c)(1),
(2) Date: May 21, 2019

(87) PCT Pub. No.: WO2018/097704
PCT Pub. Date: May 31, 2018

(65) Prior Publication Data
US 2020/0063924 A1    Feb. 27, 2020

(30) Foreign Application Priority Data
Nov. 24, 2016    (MX) .................... MX/a/2016/015395

(51) Int. Cl.
*F21K 9/68*    (2016.01)
*F21K 9/64*    (2016.01)
(Continued)

(52) U.S. Cl.
CPC .................. *F21K 9/68* (2016.08); *F21K 9/64* (2016.08); *F21V 7/06* (2013.01); *F21V 9/30* (2018.02);
(Continued)

(58) Field of Classification Search
CPC ..... F21K 9/68; F21K 9/64; F21V 7/06; F21V 9/30; F21Y 2115/10; F21Y 2103/10
See application file for complete search history.

(56) References Cited

U.S. PATENT DOCUMENTS 5,813,753 A    9/1998  Vriens et al.
2011/0194270 A1*  8/2011  Di Trapani .......... G02B 6/0041
                                                    362/2

(Continued)

FOREIGN PATENT DOCUMENTS

KR    10-2012-0136205    12/2012

OTHER PUBLICATIONS

International Search Report for PCT/MX2017/000135 dated May 8, 2018, 6 pages.
(Continued)

*Primary Examiner* — Kevin Quarterman
(74) *Attorney, Agent, or Firm* — Nixon & Vanderhye, P.C.

(57) ABSTRACT

This Optical Device is conformed by an optical reflector and a filter, the reflector is a diffuse or specular metallic surface with a reflectance of not less than 98%, of shape and dimensions according to the lamp to be affected. The optical filter is a rigid structure and transparent to visible light, with geometric shape and dimensions also according to the lamp to be affected, it is made of organic or inorganic material, and serves as a substrate on which a layer of zinc oxide is applied, specifically a nano structure of zinc oxide nano wires, to form a partially reflective and anti-reflective layer (Continued)

simultaneously as a function of the wavelength of the light that passes through it. Properly placed on the luminescent layer of a fluorescent lamp or White Light LED, this Optical Device retro reflects to said luminescent layer, most of the light of short wavelength and high enemy to be converted into longer wavelength light and lower energy by the same source luminescent layer, which results in an increase of the total light emission of at least 20%, without modifying the Chromatic Reproduction Index (CRI) of the source.

25 Claims, 7 Drawing Sheets

(51) Int. Cl.
| | | |
|---|---|---|
| | *F21V 9/30* | (2018.01) |
| | *F21V 7/06* | (2006.01) |
| | *F21Y 103/10* | (2016.01) |
| | *F21Y 115/10* | (2016.01) |

(52) U.S. Cl.
CPC ....... *F21Y 2103/10* (2016.08); *F21Y 2115/10* (2016.08)

(56) References Cited

U.S. PATENT DOCUMENTS

| | | |
|---|---|---|
| 2012/0281428 A1 | 11/2012 | Davis et al. |
| 2017/0082263 A1* | 3/2017 | Byrnes .................... F21V 5/045 |
| 2018/0023793 A1* | 1/2018 | Lowenthal .............. F21V 23/06 |
| | | 362/231 |

OTHER PUBLICATIONS

Seong-Ho Baek, et al., "Preparation of hybrid silicon wire and planar solar cells having ZnO antireflection coating by all-solution processes", Solar Energy Materials and Solar Cells, Elsevier Science Publishers, Amsterdam, NL, Oct. 7, 2011, vol. 96, No. 1, pp. 251-256.

* cited by examiner

OPTICAL DEVICE AUGMENTING THE EMISSION OF ELECTRO-LUMINESCENT LIGHT SOURCES WITH HELP OF A DICHROIC ZNO NANOROD COMPRISING FILTER

This application is the U.S. national phase of International Application No. PCT/MX2017/000135 filed Nov. 23, 2017 which designated the U.S. and claims priority to Mexican patent application no. MX/a/2016/015395 filed Nov. 24, 2016, the entire contents of each of which are hereby incorporated by reference.

BACKGROUND

1. Field of the Invention

This invention is referred to luminescent lamps, especially to the means that projects the light that they emit, and is composed of an optical device, which is suitably placed on an electro-luminescent light source, particularly on the luminescent surface of the fluorescent lamps and white light LED's used for general lighting purposes, that increases the light emitted by said lamps without affecting its Chromatic Reproduction Index CRI.

2. General Background of the Invention

In recent years, significant efforts have been made to increase the light emission of fluorescent lamps and white light LED lamps. Important achievements in this field permitted to get better efficiency values (lumen/watt) up to 115 lumens per watt for fluorescent lamps, and up to 170 lumens per watt for white light LED lamps, however many lamps of this type with less technological development are available in the market or under operation, that can no longer be benefited by these advances.

In both fluorescent lamps and white light LEDs, light is produced by discharging light of short wavelength and high energy over a layer of luminescent material, which is formed by a mixture of elements of the group of rare earths and others commonly called phosphors, where it becomes into light of shorter wavelength and less energy.

Inside conventional fluorescent lamps, light of short wavelength is emitted by the mercury contained inside said lamp in the ultraviolet range, specifically in the bandwidth that goes from 185 nm to 365 nm, with a peak at 254 nm. In the case of Semiconductor Diodes of white light (LED), inside, the semiconductor diode produces blue-violet light, in the bandwidth of 400 to 470 nm mainly, with a peak at 450 nm. In both cases when this energy is discharged on the different elements that form the phosphorus, light of different wavelengths is produced and mixed, producing the white appearance light that we all know, however the phosphors used up to the date of presentation of the present invention, they are not capable of converting the total of the high energy light produced in their interior into light of shorter wavelength, emitting a large part of said light in the range of 380 nm to 470 nm, which corresponds to the blue color-violet, where the human eye has a low relative luminous efficiency, that results in a poor use of the light emitted and therefore of the energy they consume.

To improve the performance of the fluorescent lamps and white light LEDs, this innovation is presented, with a non obvious, practical and low cost solution, which allows to increase the lumen/watt ratio of said lamps without affecting its Chromatic Reproduction Index (CRI), a solution that can also be applied to any light source of this type regardless of its degree of technological development because it is an optical device external from the light source.

The European Patent Application EP 1 746 126 A1 of Kawakatsu Akira dated on Jan. 24, 2007, describes a selective wavelength blocking material for application to different types of lamps, which is formed by a mixture of Zinc Oxide (ZnO) and Titanium Oxide (TiO2), forming a basic trigonal structure that achieve a total blocking of the emission in the UV range and partial at the beginning of the visible range, specifically up to 400 nm-430 nm with the intention, on the one hand, to avoid the damage caused by the UV radiation emitted by said lamps on the objects illuminated by these, and on the other hand to avoid the attraction of insects, offering a minimum loss of the original luminous emission of the source, however, this device does not teach an exploitation of the blocked radiation nor a distribution of ZnO, in the proportions desired to protect, in order to achieve an increase in the luminous emission of the lamp and obtain longitudinal wave parameters such as those presented in the present invention.

Japanese Patent Application JP 5 725 738 A1 of Itou Hidenori dated on Feb. 10, 1982, discloses a blocking layer arranged on a fluorescent lamp to prevent the emission of infrared radiation from 1000 nm, by means of a composite blocking layer of a material of ZnO or Indian oxide (IN2O3), which allows to control the emission of said radiations in fluorescent lamps, however said blocking layer has no any influence on the emission of visible light, as in the present invention.

Japanese Patent Application JP 2006332000 A1 of Kawakatsu Akira of Dec. 7, 2006, discloses a ultraviolet rays protective material for luminescent lamps, where a luminescent shielding material formed by a base of Zinc Oxide (ZnO) is provided as the main compound, doped with at least one particle of tungsten (W), manganese (Mn) or europium (Eu), which prevents the emission of unwanted ultraviolet radiation while converting it into visible light with a peak of 450 nm-550 nm, so it is obvious to anyone skilled in the art that this device has a very different operating principle from the present invention and that it can not be applied to white light LED lamps because they do not emit ultraviolet radiation, so it does not describe a distribution of ZnO and in the proportions that it is desired to protect, to obtain parameters of wavelengths such as those presented in the present invention.

SUMMARY OF THE INVENTION

It is therefore a first objective of the invention to provide an optical device for increasing the emission of useful light in electro-luminescent sources, by the selective retro reflection of the high energy wavelengths of said emitted light.

Another objective of the invention is to provide a device for forming a partially reflective and anti-reflective layer simultaneously, on dependence to the wavelength of the light passing through it.

Still another objective of the invention is to provide an optical device capable of retro-reflect to the luminescent layer of the source most of the high energy and short wavelength light, to be converted into longer wavelength and lower energy light by means of said luminescent layer, which results in an increase of the total light emission of at least 20%, without modifying the Chromatic Reproduction Index (CRI) of the source.

Unlike to is known till now, it is possible to recover and to harness the high-energy visible light with low benefits for the human eye that emit the fluorescent lamps and white light LEDs by the present invention, which consists of an optical reflector and a filter, that operate in combination. The reflector is a metal surface, diffuse or specular, with a reflectance of not less than 98%, with dimensions and geometry according to the lamp to be affected, whose function is to reflect the highest amount of light towards the working plane, the Optical Filter is a rigid structure, transparent to visible light with geometric shape and dimensions also according to the lamp to be affected, made of organic or inorganic material, which serves as a substrate on which a layer of Zinc Oxide is applied. The zinc oxide layer is a nano structure of Zinc Oxide nano-wires, with specific design parameters, as a lattice constant from to 200 nm to 400 nm, Filling Ratio from 0.5 to 0.8 and height from 1 to 2 micrometers, to achieve that said optical filter behaves as a partial reflector of light in the bandwidth from 380 nm to 530 nm and as an antireflective element in the range of 531 nm to 1100 nm, simultaneously.

The optical filter and the luminescent source are mechanically attached to the reflector, directing the active nano layer of Zinc Oxide toward the luminescent layer of the source, in this way the visible light of short wavelength and high energy will be mainly retro-reflected towards the phosphorus of the luminescent layer of the source, where it discharges its energy on the outer layer of the source to be converted into longer wavelength light, which results in an increase of the total light emission of at least 20% without modifying its CRI Index, since the violet blue light emitted by the lamp is not totally eliminated.

BRIEF DESCRIPTION OF THE DRAWINGS

As example and reference of the present invention the next drawings are shown

DETAILED DESCRIPTION OF THE INVENTION

The characteristic of the optical device for increasing the emission of useful light in electro-luminescent sources, by retro-selective reflection of the high-energy wavelengths of said emitted light of the present invention is clearly detailed in the following description, and for a better understanding of the characteristics of the invention, the present description is accompanied as an integral part thereof, of the non-limiting character illustrative drawings represented according to the same reference signs to indicate the parts and the figures shown.

Figure 1:
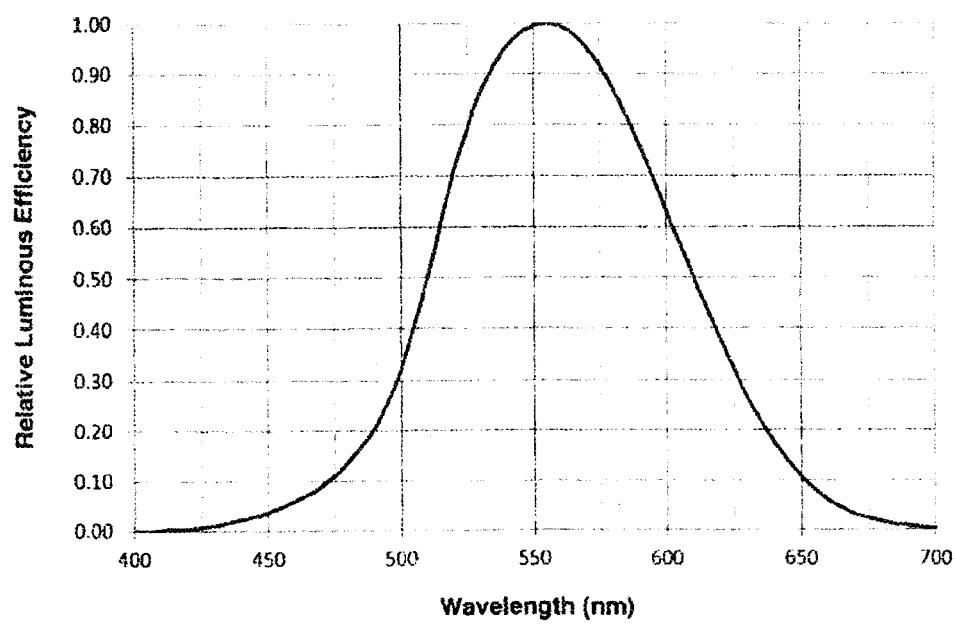
FIG. 1 Illustrates the CIE graph of photopic spectral response of the human eye.

It is known that the human eye does not perceive all the colors of the visible spectrum with the same relative luminous efficiency, in FIG. 1 the CIE graph of relative photopic luminous efficiency of the human eye is shown. As can be seen, the human eye reaches its maximum visual efficiency at 555 nm which corresponds to the green-yellow color, and on the extremes of the spectrum, this relative efficiency decreases in the wavelengths corresponding to the blue-violet colors at one end, and red at the other end, before and after these wavelengths the eye becomes "blind" to Ultra Violet and Infra Red.

Figure 2:
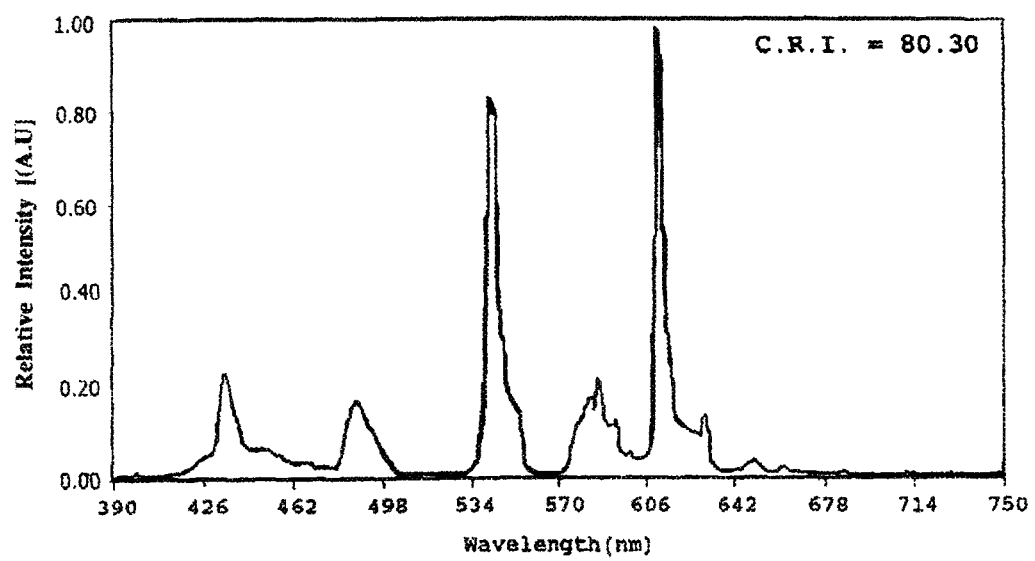
FIG. 2 Illustrates the spectral distribution of a conventional 4100° k. fluorescent lamp.
Figure 3:
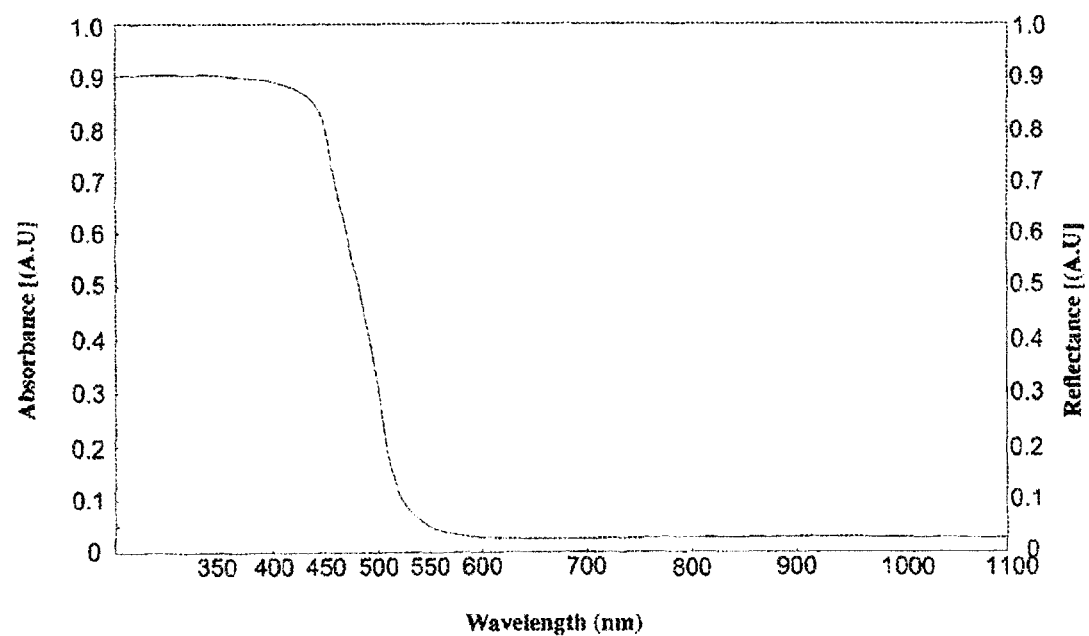
FIG. 3 Illustrates the Absorbance and Reflectance graph of the Optical Filter of the invention.

In FIG. 2, the spectral distribution in the visible range of the luminous energy emitted by a conventional fluorescent lamp, of general use in illumination, of 4100° K of color temperature is presented. As can be seen at 430 nm, there is a peak that exceeds 20% of the relative emission of the lamp at that wavelength, and another at 487 nm that reaches almost 20% of said relative intensity at that length of wave also, however in accordance with FIG. 1, at these wavelengths the relative efficiency of the human eye is only 1.5% and 15% respectively, therefore most of this high energy light is being wasted.

Opposite to what is known up till the date, this energy can be harnessed, retro-reflecting it back into the luminescent layer of the source, where its high energy is discharged, thus becomes into light of longer wavelength, for which human eye has higher relative luminous efficiency, this is achieved by this innovative Optical Assembly, whose multi-layer optical filter is capable of retro-reflect most of the high-energy visible light in the range of 380 nm to 530 nm, towards the luminescent layer of origin without eliminate it totally, and at the same time to transmite practically without losses the light corresponding to the rest of the visible range and the near infrared.

Below, two illustrative and non-limiting preferred embodiments of the present invention are described, understanding that there may be as many preferred embodiments as types of White Light electro-luminescent lamps may exists.

First Preferred Embodiment

Figure 4A:
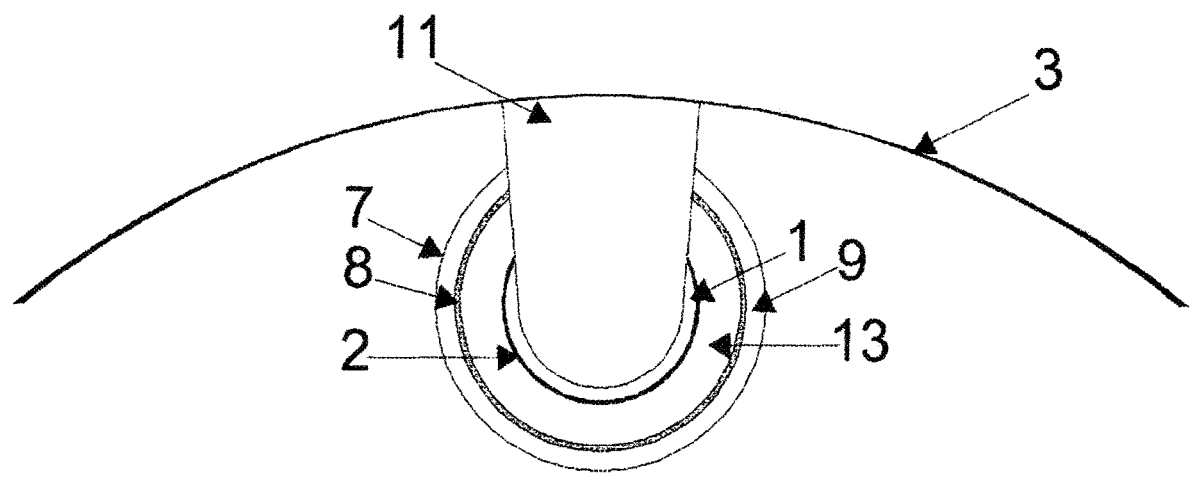
FIG. 4a Illustrates a sectional view of the first preferred embodiment, when the Optical Device is applied to a conventional fluorescent lamp.

FIG. 4a shows a sectional view, and out of scale, of the first preferred embodiment of this Optical Assembly, precisely when is applied to a conventional linear fluorescent lamp, commonly used in illumination, the same whose spectral distribution curve in the visible range is shown in FIG. 2. Some dimensions have been exaggerated for a better understanding of its operation.

In this embodiment, the optical filter 7 has a cylindrical shape and its internal diameter is greater than the fluorescent lamp 1 by at least 2 mm, which allows it to be housed inside coaxially, and its length covers the entire luminescent surface 2. The lamp 1 and the filter 7 are mechanically fastened to the metallic reflector 3, by means of two support bases 11 each arranged at each end of the fluorescent lamp 1, and also serve as a means of the electrical supply coming from the ballast (Not shown). The optical reflector 3 has a parabolic shape and is a diffused or specular metallic surface, with a thickness of 0.2 mm to 1 mm, with a diffuse or specular reflectance of not less than 98%, whose function is to reflect towards the working plane, the light generated by lamp 1, its dimensions are according to the dimensions of the lamp to be affected.

Figure 4B:
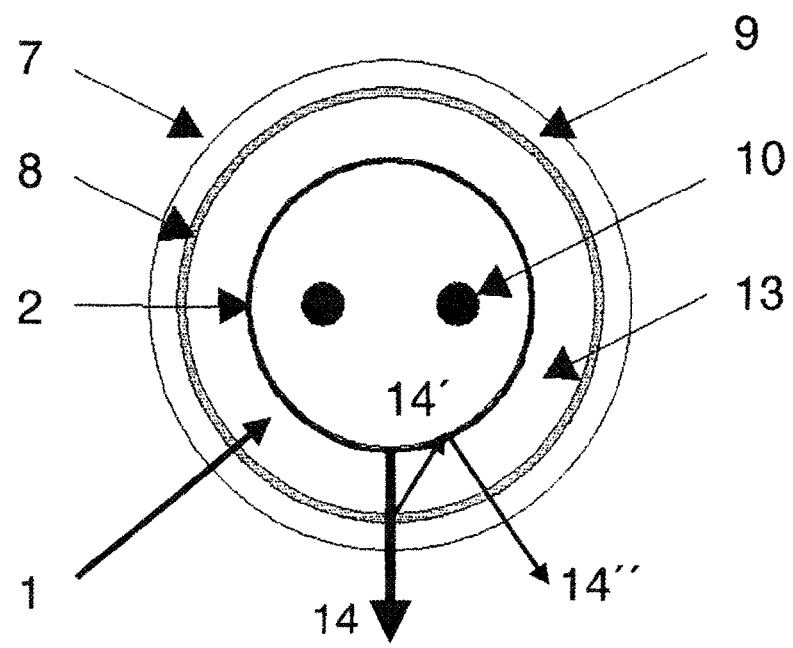
FIG. 4b Illustrates a sectional view of the first preferred embodiment, showing only the Optical Filter and the fluorescent lamp.
Figure 5:
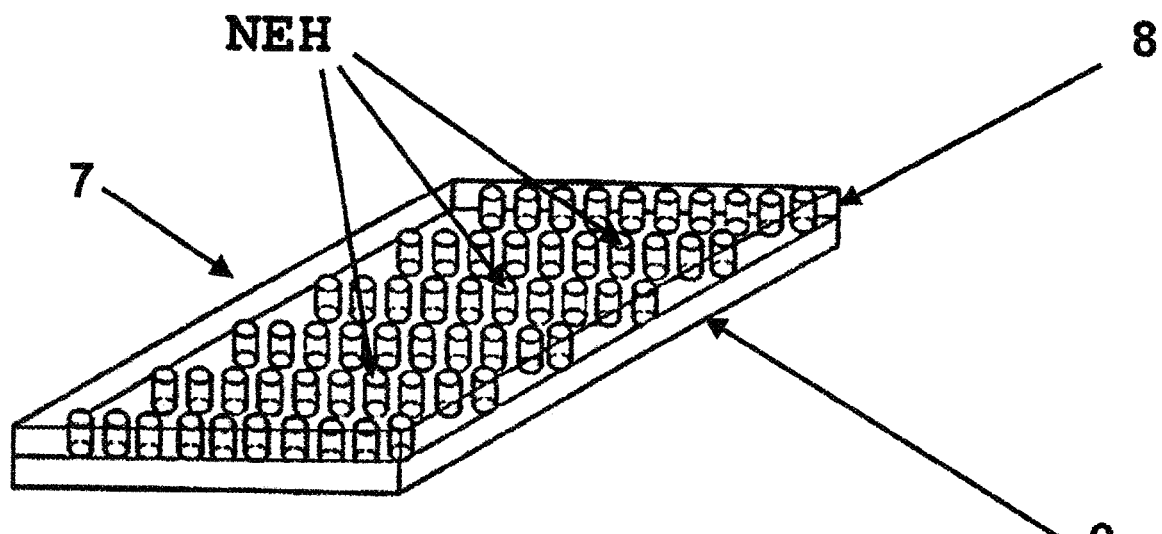
FIG. 5 Illustrates a perspective view of the nanostructure of Zinc Oxide nano-wires of the active layer of the Optical Filter.

FIG. 4b is a sectional view of the optical filter 7 containing inside the fluorescent lamp 1, uncoupled from the support bases 11 and from the optical reflector 3. Said optical filter 7 is formed by a substrate 9, made of an inorganic material transparent, for example lime or borosilicate glass, or an organic one, for example of the methylmethacrylate thermoplastic resin or a polycarbonate, with a thickness of 0.1 nm to 1 mm, on which a layer 8 with a thickness of 1.5 to 3 microns containing Zinc Oxide, which is the active layer of the optical filter 7. It is known in the art that Zinc Oxide possesses high reflectance in the Ultra Violet (UV) range and high transmission in the visible range, however, for the correct functioning of the present invention, the mainly reflective range of Zinc Oxide has been slightly prolonged until the beginning of the visible range, this is achieved by configuring it as a nano structure of Zinc Oxide nano-wires, with a lattice constant from to 200 nm to 400 nm, Filling Ratio from 0.5 to 0.8 and height from 1 to 2 micrometers, FIG. 5 shows a perspective view of said nano-wires structure (NEH) of the layer 8, applied on the substrate 9, to form the optical filter 7. The refractive indices of the substrate 9 and the layer 8 are displaced in phase 180° to achieve that the optical filter 7 behaves as a reflective and anti-reflective surface simultaneously, as a function of the wavelength of the light that passes through it.

When the luminescent lamp 2 emits a ray of light 14 and this reaches the optical filter 7, the components of wavelength greater than 540 nm pass through it practically without losses, but most of the blue-violet components 14' in the range of 380 nm to 520 nm are retroreflected back to the luminescent layer 2 by the nano-wires (NEH) of Zinc Oxide layer 8, where its high luminous energy is discharged and are newly emitted with a longer wavelength 14" which also allows them to pass through layer 8 and substrate 9 practically without loss, this results in a greater amount of light emitted at longer wavelengths where the human eye has a greater relative luminous efficiency, which results in a greater amount of lumens per Watt consumed. Because the optical filter 7 does not retro-reflect fully the high energy visible light in the range of 350 nm to 450 nm, the blue-violet colors are not totally eliminated, and therefore the Chromatic Reproduction Index of the lamp Fluorescent 1, not only is not reduced, but increases slightly from 80.3% to 81.55%.

Figure 4C:
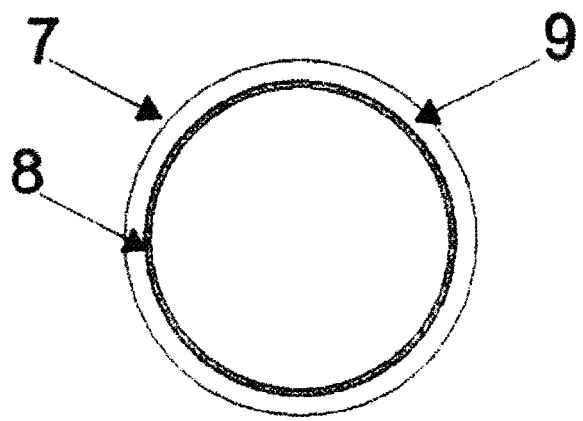
FIG. 4c illustrates a single sectional view of the Optical Filter of the first preferred embodiment.

The optical filter 7, which is shown separately in FIGS. 4c and 5, has the following optical properties: reflectance of 60% to 90% in the range from 380 nm to 490 nm; from 60% to 30% in the range of 491 nm to 500 nm; from 30% to 10% in the range of 501 nm to 530 nm and from 10% to 0% in the range of 531 nm to 1100 nm, and absorbance o of 60% to 90% in the range from 380 to 490 nm; from 60% to 30% in the range of 491 nm to 500 nm; from 30% to 10% in the range of 501 nm to 530 nm and from 10% to 0% in the range of 531 nm to 1100 nm.

Figure 6:
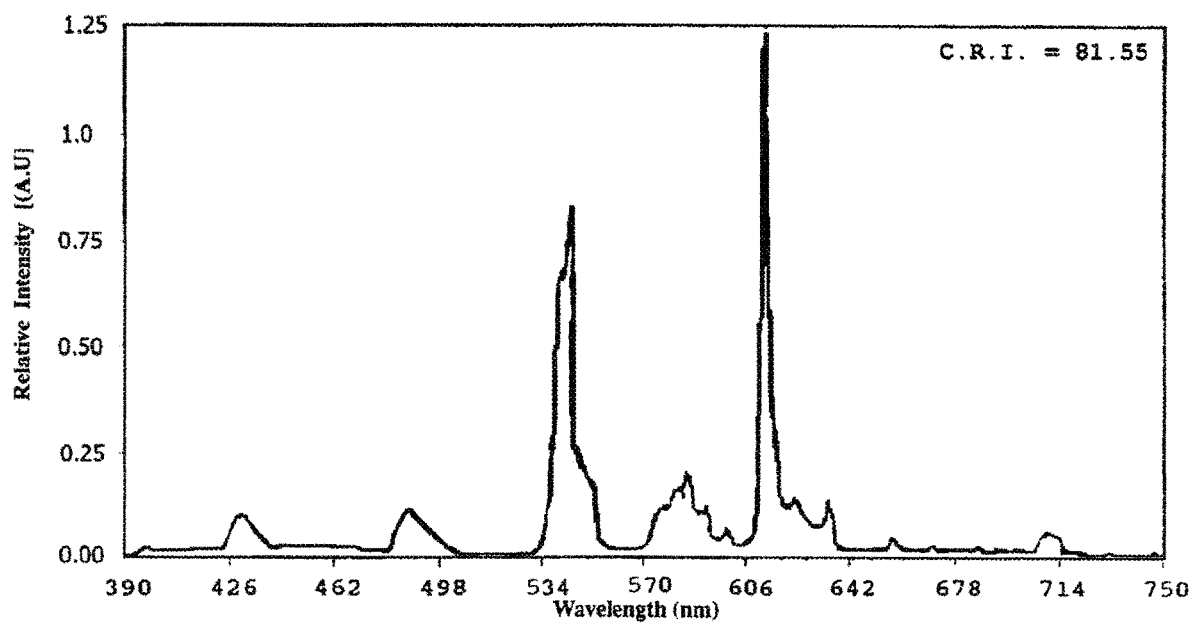
FIG. 6 Illustrates the relative spectral distribution of the same fluorescent lamp of FIG. 2, operating with the Optical Device described in the present invention.

FIG. 6 The relative spectral distribution of the same fluorescent lamp of FIG. 2 is illustrated, operating with the Optical Device described in the present invention.

Second Preferred Embodiment

Figure 7:
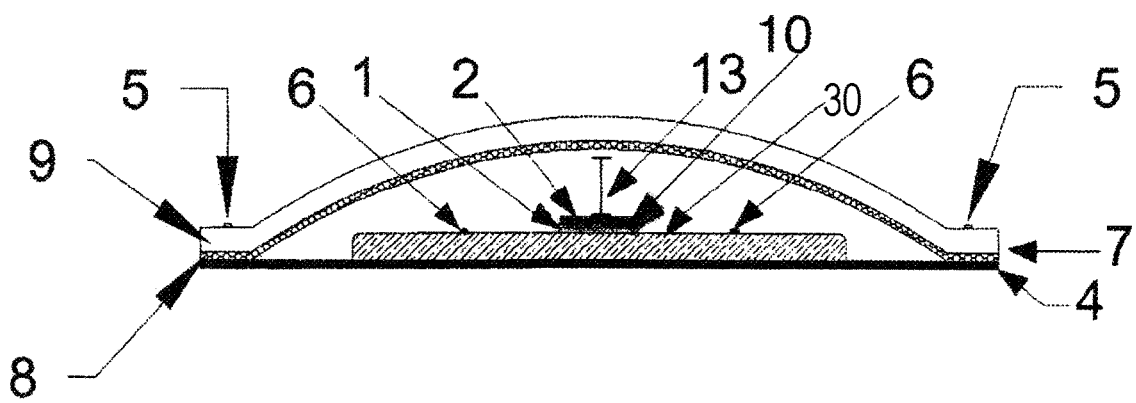
FIG. 7 Illustrates a sectional view of the second preferred embodiment when the Optical Device is applied to a linear module of white light LED lamps for general use in illumination.
Figure 8:
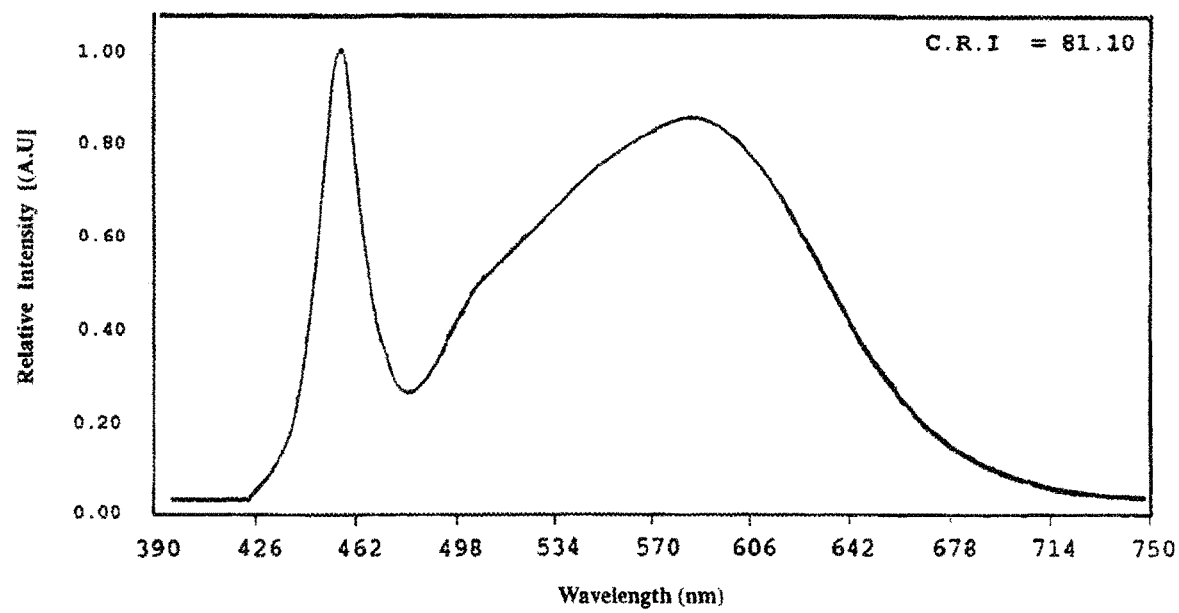
FIG. 8 Illustrates the relative spectral distribution of the white light LED lamps lineal module, 4000° K for general use in illumination of FIG. 7.

FIG. 7 A sectional view of the present invention is shown when is applied to a linear module of LED lamps of white light and of general use in lighting. Some dimensions have been exaggerated for a better operation understanding. In said FIG. 7, the module 30 is a printed circuit with several semiconductor diodes of white light (LED) 1 mounted on, arranged linearly along it equidistantly. Each LED 1 is formed by a light emitting semiconductor of short wavelength 10, on which a luminescent layer 2 is applied, the light emitting semiconductor 10 produces blue-violet light in the bandwidth of 400 nm to 470 nm, this light is discharged onto the luminescent layer 2, where it is converted into light of different wavelengths, which, when mixed, produce apparently white light, but a large amount of the light energy produced by the light-emitting semiconductor 10, passes through the luminescent layer 2 without being transformed, as shown in FIG. 8, the graph describes in detail the emission of luminous energy throughout the entire visible spectrum of said set of LEDs, and as can be seen, at 450 nm there is a peak that reaches 100% of the emission relative to that wavelength, however in accordance with FIG. 1, at this wavelength the relative efficiency of the human eye is only 2.5%, therefore most of this high energy light is also wasted.

Continuing on FIG. 7 the module 30 is attached to the reflector 4 by screws 6, the reflector 4 is a rigid and flat metal part, with a thickness 15 of 0.1 mm to 3.0 mm, depending on the power of the LED module to affect, with a minimum diffuse or specular reflectance of 98%. The Optical Filter 7 is also coupled on the reflector 4, at a minimum distance 13 not less than 2 mm to allow the dissipation of the heat generated by the light emitting semiconductor of short wavelength 10, and prevent its overheating, as well as premature deterioration of the luminescent layer 2. The optical filter 7 has a semicircular shape with a diameter double the width of the linear module of White Light LED lamps and with two horizontal side wings arranged at the ends of the semicircle of at least 2 mm in width forming a single piece in omega shape.

Figure 9:
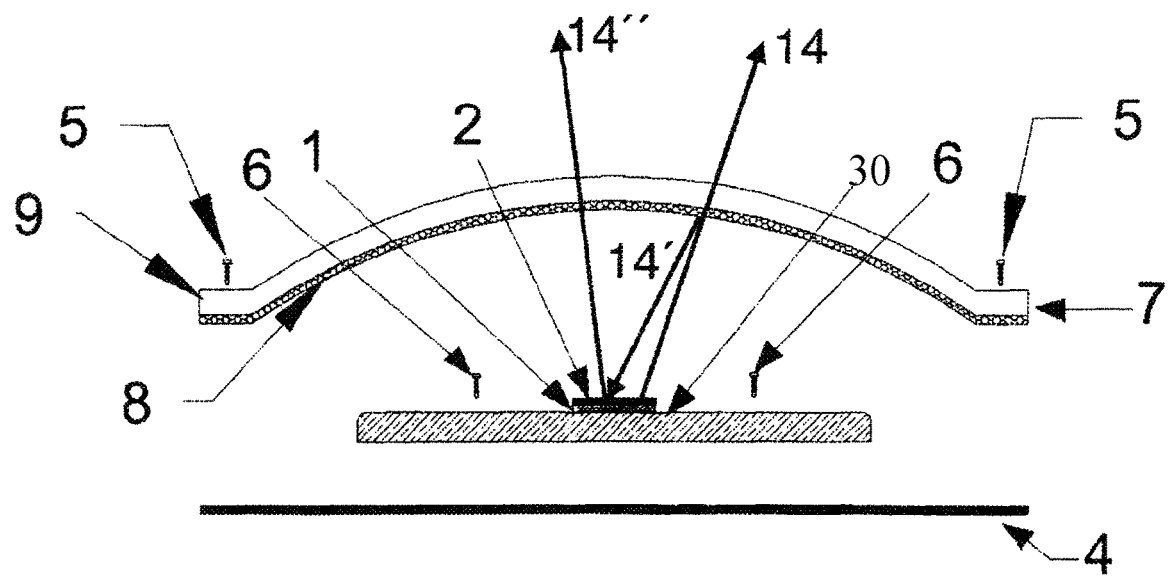
FIG. 9 illustrates a sectional view of the second preferred embodiment, showing the Filter and Reflector Optical decoupled from the linear module of LED lamps.

FIG. 9 The optical reflector 4 and the uncoupled module 30 of the optical filter 7 are shown, in this mode said optical filter 7 has a semicircular shape, with a diameter of twice the width of the linear module of White Light LED lamps, and has two wings horizontal laterals arranged at the ends of the semicircle of at least 2 mm wide forming a single piece in the shape of an omega and as in the previous embodiment is formed by a substrate 9, made of a transparent inorganic material, for example glass soda lime or borosilicate, or an organic one, for example thermoplastic resin methyl-methacrylate or a polycarbonate, with a thickness of 0.1 mm to 1 mm, on which a layer 8 with a thickness of 1.5 to 3 micrometers containing Zinc Oxide, which is the active layer of the optical filter 7. It is known in the art that Zinc Oxide possesses high reflectance in the Ultra Violet (UV) range and high transmission in the visible range, however, for the correct functioning of the present invention, the mainly reflective range of Zinc Oxide has been slightly prolonged until the beginning of the visible range, this is achieved by configuring it as a nano structure of Zinc Oxide nano-wires, with a lattice constant from to 200 nm to 400 nm, Filling Ratio from 0.5 to 0.8 and height from 1 to 2 micrometers, FIG. 5 shows a perspective view of said nano-wires structure (NEH) of the layer 8, applied on the substrate 9, to form the optical filter 7. The refractive indices of the substrate 9 and the layer 8 are displaced in phase 180° to achieve that the optical filter 7 behaves as a reflective and anti-reflective surface simultaneously, as a function of the wavelength of the light that passes through it.

In said FIG. 9 when the luminescent layer 2 emits a beam of light 14, and this reaches the optical filter 7, the components of wavelength greater than 540 nm pass through it practically without losses, but most of the blue-green components violet 14' in the range of 380 nm to 520 nm are retroreflected back to the luminescent layer 2 by the nano structure NEH of Zinc Oxide nano wires of layer 8, where its high luminous energy is discharged and are newly emitted at a longer wavelength 14" which allows them also to go trough the layer 8 and substrate 9 practically without losses, this results in a greater amount of light emitted at wavelengths where the human eye has a greater relative luminous efficiency, which results in a greater amount of lumens per Watt consumed.

Thanks to the fact that the optical filter 7 does not retro-reflect totally the high energy visible light in the range of 350 nm to 450 nm, the blue-violet colors are not totally eliminated, and therefore the Chromatic Reproduction Index of the lamps LED 1, not only is not reduced, but slightly increased by 81.10% to 83.48%.

In addition, the White Light LED lamps linear module is located outside the geometric focus of the semicircular optical filter and the reflector is 50% wider than the linear module of White Light LED lamps and has the same length as this one.

The optical filter 7, which is shown separately in FIGS. 7 and 9, which is shown in detail in FIG. 5, has the following optical properties: reflectance of 60% to 90% in the range from 380 nm to 490 nm; from 60% to 30% in the range of 491 nm to 500 nm; from 30% to 10% in the range of 501 nm to 530 nm and from 10% to 0% in the range of 531 nm to 1100 nm, and absorbance of 60% to 90% in the range from 380 nm to 490 nm; from 60% to 30% in the range of 491 nm to 500 nm; from 30% to 10% in the range of 501 nm to 530 nm and from 10% to 0% in the range of 531 nm to 1100 nm.

Figure 10:
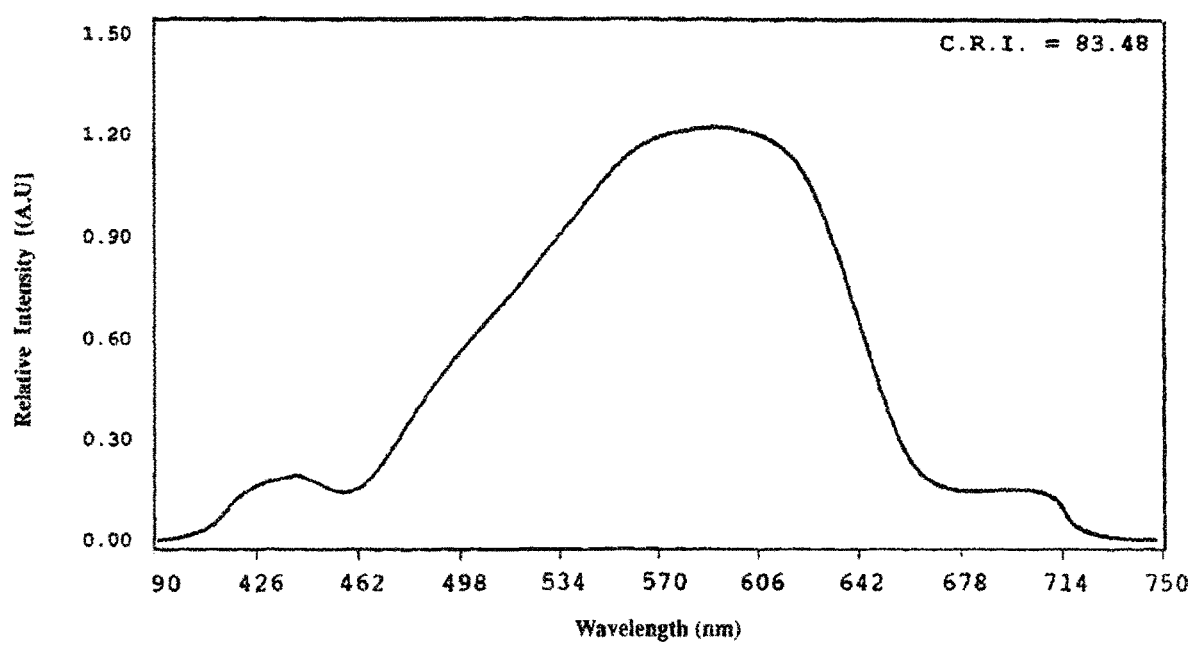
FIG. 10 Illustrates the relative spectral distribution of the LED lamp assembly of the Module of FIG. 6 operating with the Optical Device described in the present invention.

FIG. 10 shows the new spectral distribution in the visible range produced by the same linear Module 30 of White Light LED lamps of FIG. 6 when it is affected by this innovative Optical Device.

According as the invention has been described, a person skilled in the art will find that it can be modified in different ways. Such modifications shall be considered as not departing from the spirit and scope of the invention.

In addition, the description includes any combination or sub-combination of the elements of different species and/or modalities described herein. A person skilled in the art will recognize that these features, and therefore the scope of this disclosure, should be interpreted in the light of the following claims and any equivalents thereof.

The invention claimed is:

1. An optical device to be applied to electro-luminescent lamps that include, at least, fluorescent lamps and white light emitting diodes (LED), the optical device configured to be external to a source for generating light comprising:
   an optical reflector; and
   a multilayer optical filter, wherein
   the optical reflector includes a specular or diffuse metallic surface, having a reflectance of not less than 98%, the specular or diffuse metallic surface is configured to reflect the light generated by the source towards a work plane;
   the multilayer optical filter includes a transparent and rigid multilayer structure having a transparent organic or inorganic material that serves as a substrate on which a layer of zinc oxide is applied, the layer of zinc oxide being an active layer of the multilayer optical filter, the layer of zinc oxide having a thickness of 1.5 to 3 micrometers, and containing, in an interior of the layer of zinc oxide, a nanostructure of zinc oxide nano wires having a lattice constant from 200 nm to 400 nm, a filling ratio from 0.5 to 0.8, and a height from 1 to 2 micrometers, said multilayer optical filter configured to behave as a partial light reflector in a bandwidth range of 380 nm to 530 nm and further configured to behave as an antireflective element in the bandwidth range of 531 nm to 1100 nm; and
   the refractive indexes of the substrate and the zinc oxide layer of the multilayer optical filter are displaced in phase 180°.

2. The optical device according to claim 1, wherein the multilayer optical filter completely covers an emission angle of a luminescent layer, of the source, without being in contact with the luminescent layer of the source.

3. The optical device according to claim 1, wherein the inorganic material is made of lime or borosilicate glass having a thickness of 0.1 mm to 1.0 mm.

4. The optical device according to claim 1, wherein the organic material is made of a thermoplastic resin with a thickness of 0.1 mm to 1.0 mm, the thermoplastic resin being any of methyl-methacrylate or a polycarbonate.

5. The optical device according to claim 1, wherein the optical reflector has a parabolic shape when applied to a linear fluorescent lamp.

6. The optical device according to claim 1, wherein an inner surface of an linear fluorescent lamp is covered by an electro-luminescent material.

7. The optical device according to claim 1, wherein the multilayer optical filter has a cylindrical shape, when applied to linear fluorescent lamps.

8. The optical device according to claim 1, wherein an inner diameter of the multilayer optical filter is greater than an outer diameter of the fluorescent lamp by at least 2 mm.

9. The optical device according to claim 1, wherein a linear fluorescent lamp is housed within the multilayer optical filter coaxially.

10. The optical device according to claim 9, wherein the multilayer optical filter and the linear fluorescent lamp are mechanically attached to the optical reflector via two bases, each positioned at an end of the linear fluorescent lamp.

11. The optical device according to claim 1, wherein the optical reflector is flat when the source includes linear module for LED lamps.

12. The optical device according to claim 1, wherein a white light LED linear module is mounted on the optical reflector using screws having symmetrical placement.

13. The optical device according to claim 1, wherein the optical reflector is 50% wider than a linear module of a white light LED lamp.

14. The optical device according to claim 1, wherein a linear module of a white light LED lamp includes a printed circuit on which at least one or more semiconductor light emitting diodes are mounted.

15. The optical device according to claim 1, wherein the multilayer optical filter has a semicircular shape having a diameter of twice a width of a linear module of a white light LED lamp, and having two horizontal side wings arranged at each end of the semicircular shape, the two horizontal wings being at least 2 mm wide and forming a single piece.

16. The optical device according to claim 1, wherein the multilayer optical filter is mounted on the optical reflector via screws, with the active layer of the multilayer optical filter facing a luminescent layer of semiconductor diodes or white LEDs.

17. The optical device according to claim 1, wherein a linear module of a white light LED is disposed outside a geometric focus of a semicircular optical filter.

18. The optical device according to claim 1, wherein the multilayer optical filter has a reflectance of 60% to 90% in a wavelength range from 380 nm to 490 nm.

19. The optical device according to claim 1, wherein the multilayer optical filter has a reflectance of 30% to 60% in a wavelength range from 491 nm to 500 nm.

20. The optical device according to claim 1, wherein the multilayer optical filter has a reflectance of 10% to 30% in a wavelength range from 501 nm to 530 nm.

21. The optical device according to claim 1, wherein the multilayer optical filter has a reflectance of 0% to 10% in a wavelength range from 531 nm to 1100 nm.

22. The optical device according to claim 1, wherein the multilayer optical filter has an absorbance of 60% to 90% in a wavelength range from 380 nm to 490 nm.

23. The optical device according to claim 1, wherein the multilayer optical filter has an absorbance of 30% to 60% in a wavelength range from 491 nm to 500 nm.

24. The optical device according to claim 1, wherein the multilayer optical filter has an absorbance of 10% to 30% in a wavelength range from 501 nm to 530 nm.

25. The optical device according to claim 1, wherein the multilayer optical filter has an absorbance of 0% to 10% in a wavelength range from 531 nm to 1100 nm.

* * * * *